(12) United States Patent
Takeda et al.

(10) Patent No.: US 8,481,244 B2
(45) Date of Patent: *Jul. 9, 2013

(54) EPOXY-CONTAINING POLYMER, PHOTO-CURABLE RESIN COMPOSITION, PATTERNING PROCESS, AND ELECTRIC/ELECTRONIC PART PROTECTIVE FILM

(75) Inventors: Takanobu Takeda, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 306 days.

This patent is subject to a terminal disclaimer.

(21) Appl. No.: 12/889,730

(22) Filed: Sep. 24, 2010

(65) Prior Publication Data

US 2011/0076465 A1 Mar. 31, 2011

(30) Foreign Application Priority Data

Sep. 30, 2009 (JP) ................................ 2009-226214

(51) Int. Cl.
| | |
|---|---|
| G03F 7/038 | (2006.01) |
| G03F 7/40 | (2006.01) |
| G03F 7/075 | (2006.01) |
| C08L 83/06 | (2006.01) |
| C08L 83/14 | (2006.01) |
| H01L 21/312 | (2006.01) |
| C09D 183/06 | (2006.01) |

(52) U.S. Cl.
USPC ............ 430/280.1; 528/27; 430/18; 430/331; 430/330; 430/325

(58) Field of Classification Search
None
See application file for complete search history.

(56) References Cited

U.S. PATENT DOCUMENTS

| | | | |
|---|---|---|---|
| 3,159,601 | A | 12/1964 | Ashby |
| 3,159,662 | A | 12/1964 | Ashby |
| 3,220,972 | A | 11/1965 | Lamoreaux |
| 3,775,452 | A | 11/1973 | Karstedt |
| 6,590,010 | B2 | 7/2003 | Kato et al. |
| 2002/0192477 | A1* | 12/2002 | Honda et al. .................. 428/447 |
| 2008/0182087 | A1 | 7/2008 | Kato et al. |
| 2011/0143092 | A1* | 6/2011 | Asai et al. ..................... 430/141 |
| 2012/0094222 | A1* | 4/2012 | Soga et al. ....................... 430/17 |
| 2012/0108762 | A1* | 5/2012 | Kondo et al. ................. 525/476 |
| 2012/0213993 | A1* | 8/2012 | Takeda et al. .......... 428/355 EP |

FOREIGN PATENT DOCUMENTS

| | | |
|---|---|---|
| EP | 1186624 A1 | 3/2002 |
| EP | 1953183 A2 | 8/2008 |
| JP | 2002-088158 A | 3/2002 |
| JP | 2005-306949 a  * | 11/2005 |
| JP | 2008-184571 A | 8/2008 |
| JP | -2009-161619 a  * | 7/2009 |

OTHER PUBLICATIONS

English translation of JP, 2005-306949, A (2005) from machine translation from AIPN Japan Patent Office National Center for Industrial Property Information and Training, generated Sep. 19, 2012, 20 pages.*

English translation of JP, 2009-161619, A (2009) from machine translation from AIPN Japan Patent Office National Center for Industrial Property Information and Training, generated Sep. 19, 2012, 18 pages.*

European Search Report dated Feb. 21, 2011, issued in corresponding European Patent Application No. 10251635.8.

* cited by examiner

Primary Examiner — Cynthia Hamilton
(74) Attorney, Agent, or Firm — Westerman, Hattori, Daniels & Adrian, LLP

(57) ABSTRACT

A photo-curable resin composition comprising an epoxy-containing silphenylene or silicone polymer with a Mw of 3,000-500,000 forms a coating which is useful as a protective film for electric/electronic parts.

9 Claims, 1 Drawing Sheet

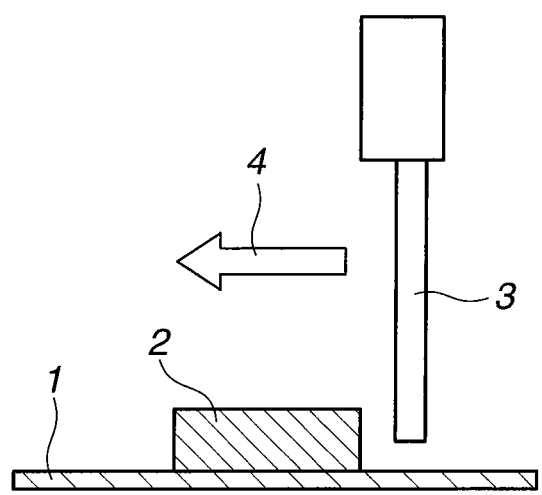

EPOXY-CONTAINING POLYMER, PHOTO-CURABLE RESIN COMPOSITION, PATTERNING PROCESS, AND ELECTRIC/ELECTRONIC PART PROTECTIVE FILM

CROSS-REFERENCE TO RELATED APPLICATION

This non-provisional application claims priority under 35 U.S.C. §119(a) on Patent Application No. 2009-226214 filed in Japan on Sep. 30, 2009, the entire contents of which are hereby incorporated by reference.

TECHNICAL FIELD

This invention relates to novel epoxy-containing polymers, photo-curable resin compositions comprising the same, patterning processes using the compositions, and coatings of the compositions for the protection of electric/electronic parts such as substrates, circuit boards, and interconnections. In particular, by virtue of their heat resistance, chemical resistance, insulation, and flexibility, the protective coatings are useful as dielectric films for semiconductor devices inclusive of re-wiring purposes, dielectric films for multilayer printed wiring boards, solder masks, isolation films for through-silicon-vias (TSVs), and cover-lay films, and in substrate laminating applications.

BACKGROUND ART

Prior art protective films for semiconductor devices and dielectric films for multilayer printed wiring boards utilize photosensitive polyimide, epoxy and silicone resins. While many photosensitive materials are known for the protection of such substrates and wiring boards, JP-A 2002-88158 proposes a photosensitive silicone composition having the advantage of flexibility. Although this photosensitive silicone composition cures at low temperature to form a film which is reliable due to improved moisture-resistant adhesion, it is desired to have chemical resistance in photoresist strippers having a high dissolving power such as N-methyl-2-pyrrolidone. On the other hand, JP-A 2008-184571 discloses a photosensitive silicone composition based on a silphenylene structure-bearing silicone polymer. Although this photosensitive silicone composition has improved chemical resistance in liquid photoresist strippers, it is desired to have more chemical resistance in solder flux fluid and further improved reliability as the semiconductor device protective film.

Citation List
Patent Document 1: JP-A 2002-88158
Patent Document 2: JP-A 2008-184571 (US 2008182087, EP 1953183)

DISCLOSURE OF INVENTION

An object of the invention is to provide a novel polymer having an epoxy group-containing structure and a photo-curable resin composition comprising the polymer, that forms a thick film which can be processed to define a fine feature size pattern and post-cured at low temperature into a cured film having improved characteristics, especially chemical resistance in solder flux fluid, the cured film being reliable as a protective film for electric/electronic parts and especially resistant to cracking in a thermal cycling test. Another object is to provide a patterning process using the composition and a protective film of the composition for the protection of electric/electronic parts.

The inventors have found that a photo-curable resin composition comprising an epoxy-containing polymer of the general formula (1), shown below, forms a coating which effectively serves as a protective film for the protection of electric/electronic parts.

In a first aspect, the invention provides an epoxy-containing polymer comprising recurring units of the following general formula (1) and having a weight average molecular weight of 3,000 to 500,000.

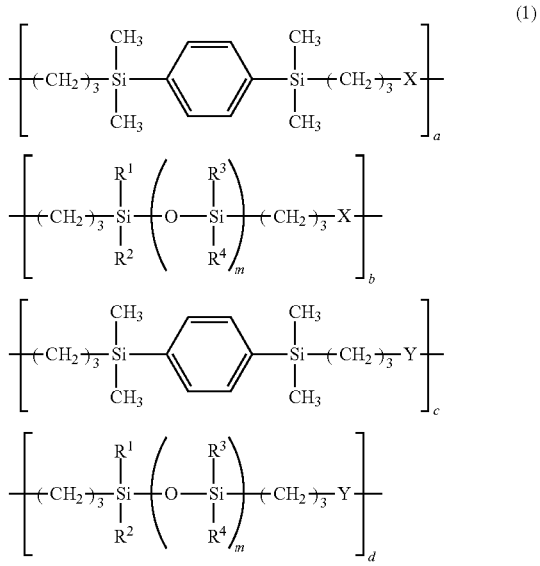

Herein $R^1$ to $R^4$ are each independently a monovalent hydrocarbon radical of 1 to 8 carbon atoms, m is an integer of 1 to 100, a, b, c and d each are 0 or a positive number, with the proviso that c and d are not equal to 0 at the same time, satisfying $0 < (c+d)/(a+b+c+d) \leq 1.0$, X and Y are each independently a divalent organic radical of the general formula (2) or (3) with proviso that at least one divalent organic radical of formula (3) is present:

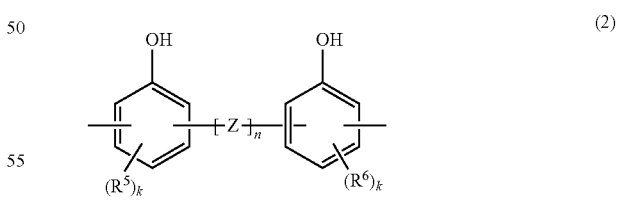

Herein Z is a divalent organic radical selected from the group consisting of

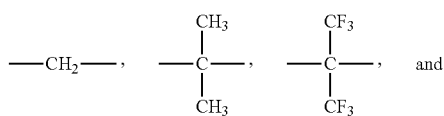

-continued

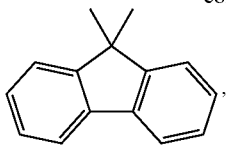

n is 0 or 1, $R^5$ and $R^6$ are each independently an alkyl or alkoxy radical of 1 to 4 carbon atoms, and k is 0, 1 or 2.

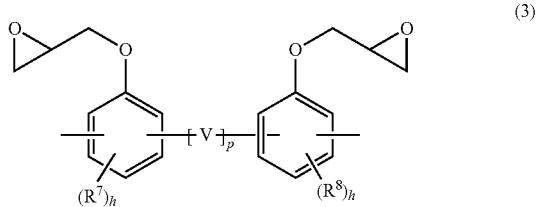

(3)

Herein V is a divalent organic radical selected from the group consisting of

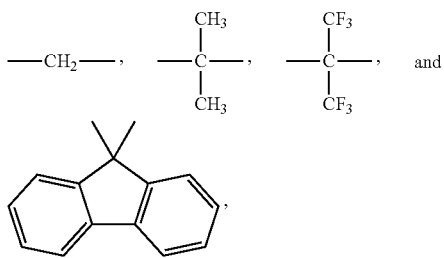

p is 0 or 1, $R^7$ and $R^8$ are each independently an alkyl or alkoxy radical of 1 to 4 carbon atoms, and h is 0, 1 or 2.

Preferably, a, b, c and d in formula (1) satisfy $0.05 \leq c/(a+b+c+d) \leq 0.3$ and/or $0.05 \leq d/(a+b+c+d) \leq 0.3$.

In a second aspect, the invention provides a photo-curable resin composition comprising (A) the polymer defined above, (B) at least one crosslinking agent selected from the group consisting of an amino condensate modified with formalin or formalin-alcohol and a phenol compound having on the average at least two methylol or alkoxymethylol radicals in the molecule, (C) a photoacid generator which is decomposed to generate an acid upon exposure to radiation having a wavelength of 190 to 500 nm, (D) a solvent, and optionally (E) a basic compound.

In a third aspect, the invention provides a process for forming a pattern, comprising the steps of (i) applying the photo-curable resin composition onto a substrate to form a coating thereon, (ii) exposing the coating to radiation having a wavelength of 190 to 500 nm through a photomask, (iii) heat treating the exposed coating and developing it with a developer, and optionally (iv) post-curing the patterned coating resulting from the developing step at a temperature in the range of 100 to 250° C.

In a fourth aspect, the invention provides an electric/electronic part protective film comprising the cured coating obtained by the process of the third aspect.

ADVANTAGEOUS EFFECTS OF INVENTION

The epoxy-containing polymer of the invention is used to formulate a photo-curable resin composition from which a fine feature size pattern can be formed with radiation in a wide wavelength range and in a widely varying thickness. Once the photo-curable resin composition is patterned with radiation, it is post-cured at low temperature to form a cured film which has improved properties including adhesion to substrates, mechanical strength, electric insulation, and chemical resistance in solder flux fluids. When applied to semiconductor devices, the film is effective to prevent cracks from developing under the impetus of stresses in a reliability test of thermal cycling. The composition is advantageously used in forming protective films such as dielectric films and adhesive layers in electronic parts including semiconductor devices such as light emitting and receiving devices, and wiring boards for electric/electronic parts.

BRIEF DESCRIPTION OF DRAWINGS

FIG. 1 is a schematic view of an adhesion test in Examples.

DESCRIPTION OF EMBODIMENTS

One embodiment of the invention relates to an epoxy-containing polymer comprising recurring units of the general formula (1) and having a weight average molecular weight of 3,000 to 500,000.

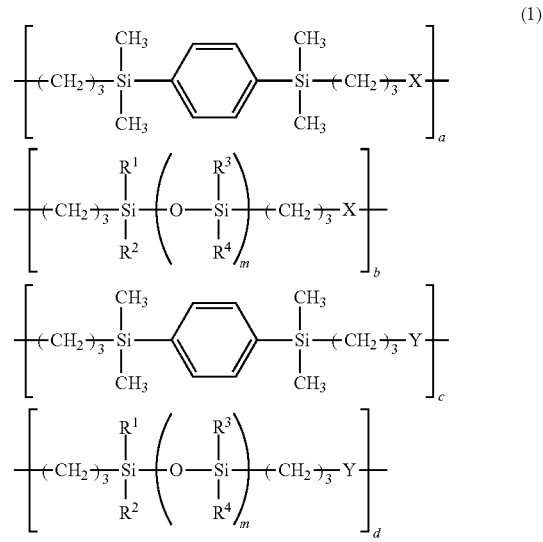

(1)

Herein each of $R^1$ to $R^4$, which may be the same or different, stands for a monovalent hydrocarbon radical having 1 to 8 carbon atoms, and preferably 1 to 6 carbon atoms. Examples include straight, branched or cyclic alkyl radicals such as methyl, ethyl, propyl, isopropyl, n-butyl, tert-butyl, and cyclohexyl, straight, branched or cyclic alkenyl radicals such as vinyl, allyl, propenyl, butenyl, hexenyl, and cyclohexenyl, aryl radicals such as phenyl and tolyl, and aralkyl radicals such as benzyl and phenylethyl.

From the standpoints of compatibility with a crosslinking agent and a photoacid generator to be described later and photo-curability, m is an integer of 1 to 100, preferably 1 to 80. From the standpoints of substrate adhesion, electrical properties, and reliability, a, b, c and d each are 0 or a positive number, with the proviso that c and d are not equal to 0 at the same time, and these subscripts satisfy the range: $0 < (c+d)/(a+b+c+d) \leq 1.0$, preferably $0.1 \leq (c+d)/(a+b+c+d) \leq 0.5$, and more preferably $0.15 \leq (c+d)/(a+b+c+d) \leq 0.25$.

In a preferred embodiment, a, b, c and d satisfy the ranges: $0.05 \leq c/(a+b+c+d) \leq 0.5$, preferably $0.05 \leq c/(a+b+c+d) \leq 0.3$, more preferably $0.05 \leq c/(a+b+c+d) \leq 0.15$, and $0.05 \leq d/(a+b+c+d) \leq 0.5$, preferably $0.05 \leq d/(a+b+c+d) \leq 0.3$, more preferably $0.1 \leq d/(a+b+c+d) \leq 0.2$. It is noted that $a+b+c+d=1$, and $a+b$ is the balance wherein either a or b may be 0.

X and Y are each independently selected from divalent aromatic radicals having a phenolic hydroxyl radical of the general formula (2) or (3). The polymer of the present invention has at least one divalent organic radical of the general formula (3).

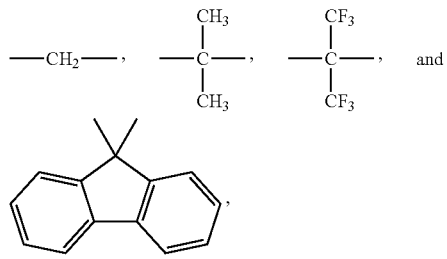

(2)

Herein Z is a divalent organic radical selected from

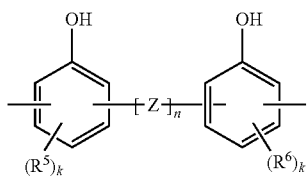

n is 0 or 1, each of $R^5$ and $R^6$ which may be the same or different is an alkyl or alkoxy radical of 1 to 4 carbon atoms, and k is 0, 1 or 2. Examples of $R^5$ and $R^6$ include methyl, ethyl, isopropyl, tert-butyl, methoxy, ethoxy, and isopropyloxy.

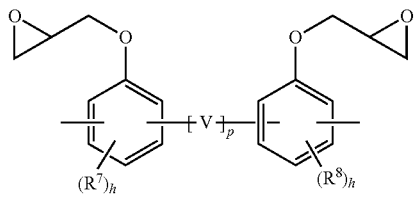

(3)

Herein V is a divalent organic radical selected from

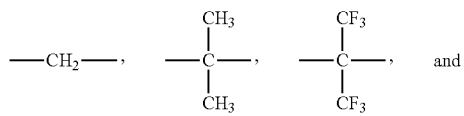

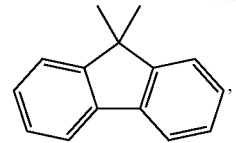

p is 0 or 1, each of $R^7$ and $R^8$ which may be the same or different is an alkyl or alkoxy radical of 1 to 4 carbon atoms, and h is 0, 1 or 2. Examples of $R^7$ and $R^8$ are as exemplified for $R^5$ and $R^6$.

The silphenylene-bearing polymer should have a weight average molecular weight (Mw) of 3,000 to 500,000 and preferably 5,000 to 300,000, from the standpoints of compatibility and photo-curability of a composition comprising the polymer as well as mechanical properties of the cured composition. It is noted that Mw is determined by gel permeation chromatography (GPC) versus polystyrene standards.

The silphenylene-bearing polymer may be prepared through polymerization reaction, known as "hydrosilylation," of hydrogensilphenylene (or 1,4-bis(dimethylsilyl)benzene) of the formula (4) and optionally a dihydroorganosiloxane of the formula (5) with a specific epoxy-containing diallyl compound of the formula (6) and optionally a specific diallyl phenol compound of the general formula (7) in the presence of a catalyst.

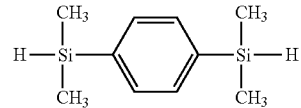

(4)

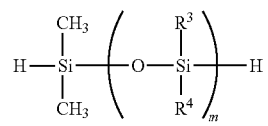

(5)

Herein, $R^3$, $R^4$ and m are as defined above.

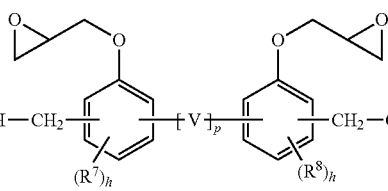

(6)

Herein, V, $R^7$, $R^8$, p and h are as defined above.

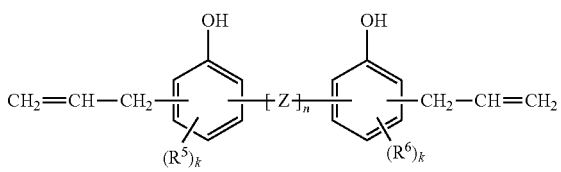

(7)

Herein, Z, $R^5$, $R^6$, n and k are as defined above.

It is understood that the weight average molecular weight of the epoxy-containing polymer comprising recurring units of formula (1) can be easily controlled by adjusting a ratio of the total number of allyl radicals on the diallyl phenol compounds of formulae (6) and (7) to the total number of hydrosilyl radicals on the hydrogensilphenylene of formula (4) and optional dihydroorganosiloxane of formula (5) (i.e., total allyl radicals/total hydrosilyl radicals). Alternatively, a polymer having the desired molecular weight may be produced by effecting polymerization of the diallyl phenol compound(s) with the hydrogensilphenylene and optional dihydroorganosiloxane while using a monoallyl compound (e.g., o-allylphenol), a monohydrosilane (e.g., triethylhydrosilane) or monohydrosiloxane as a molecular weight modifier.

The catalysts which can be used in the polymerization reaction include platinum group metal elements such as platinum (inclusive of platinum black), rhodium and palladium; platinum chloride, chloroplatinic acid and chloroplatinic acid salts such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, and $Na_2HPtCl_4 \cdot xH_2O$ wherein x is specifically an integer of 0 to 6, more specifically 0 or 6; alcohol-modified chloroplatinic acid as described in U.S. Pat. No. 3,220,972; complexes of chloroplatinic acid with olefins as described in U.S. Pat. Nos. 3,159,601, 3,159,662 and 3,775,452; platinum group metals such as platinum black and palladium on supports such as alumina, silica and carbon; rhodium-olefin complexes; chlorotris(triphenylphosphine)rhodium, known as Wilkinson catalyst; and complexes of platinum chloride, chloroplatinic acid or chloroplatinic acid salts with vinyl-containing siloxanes (specifically, vinyl-containing cyclic siloxanes).

The catalyst is used in a catalytic amount, specifically 0.001 to 0.1% by weight of platinum group metal based on the total weight of reactants for polymerization reaction.

If desired, a solvent may be used in the polymerization reaction. Suitable solvents include hydrocarbon solvents such as toluene and xylene.

With respect to polymerization conditions, the polymerization temperature is preferably in the range of 40 to 150° C., and more preferably 60 to 120° C. At temperatures within the range, polymerization can be completed within a short time and the catalyst is not deactivated.

The polymerization time may vary with the type and amount of a desired polymer. Preferably polymerization is completed within about 0.5 to 100 hours, and more preferably about 0.5 to 30 hours, in order to prevent moisture entry into the polymerization system. At the end of polymerization, the solvent is distilled off if the solvent is used. In this way, an epoxy-containing polymer comprising recurring units of formula (1) is obtained.

The second embodiment of the invention relates to a photo-curable resin composition comprising (A) an epoxy-containing polymer comprising recurring units of formula (1), (B) at least one crosslinking agent selected from among amino condensates modified with formalin or formalin-alcohol and phenol compounds having on the average at least two methylol or alkoxymethylol radicals in the molecule, (C) a photoacid generator which is decomposed to generate an acid upon exposure to radiation of 190 to 500 nm wavelength, (D) a solvent, and optionally, (E) a basic compound.

Component (B), crosslinking agent induces curing reaction with the polymer for facilitating pattern formation and augmenting the strength of a cured product. The crosslinking agent used herein should preferably have a weight average molecular weight (Mw) of 150 to 10,000, and more preferably 200 to 3,000, from the standpoints of photo-curability and heat resistance.

One or more amino condensates and/or phenol compounds may be used as the crosslinking agent. The amino condensates used herein include melamine condensates modified with formalin or formalin-alcohol, and urea condensates modified with formalin or formalin-alcohol.

The modified melamine condensates are prepared, for example, by modifying a melamine monomer with formalin into a methylol form in a well-known manner, and optionally, further modifying it with an alcohol into an alkoxy form, thereby yielding a modified melamine of the formula (8) shown below. The alcohols used herein are lower alcohols, for example, alcohols having 1 to 4 carbon atoms.

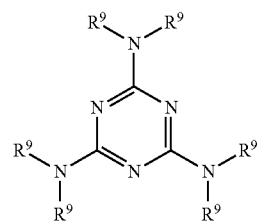

(8)

Herein, $R^9$, which may be the same or different, is a methylol radical, an alkoxymethyl radical containing an alkoxy portion of 1 to 4 carbon atoms, or hydrogen, and at least one $R^9$ is a methylol or alkoxymethyl radical. Specifically, $R^9$ is a methylol radical, an alkoxymethyl radical such as methoxymethyl or ethoxymethyl, or hydrogen.

Illustrative, non-limiting, examples of the modified melamine of formula (8) include trimethoxymethylmonomethylolmelamine, dimethoxymethylmonomethylolmelamine, trimethylolmelamine, hexamethylolmelamine, and hexamethoxymethylolmelamine.

Next, the modified melamine of formula (8) or an oligomer thereof (e.g., dimer or trimer) is subjected to addition condensation polymerization with formaldehyde in a customary way until a desired molecular weight is reached, thereby obtaining the formalin or formalin-alcohol-modified melamine condensate.

Also, the urea condensates modified with formalin or formalin-alcohol are prepared, for example, by modifying a urea condensate having a desired molecular weight with formalin into a methylol form in a well-known manner, and optionally, further modifying it with an alcohol into an alkoxy form.

Illustrative examples of the modified urea condensate include methoxymethylated urea condensates, ethoxymethylated urea condensates, and propoxymethylated urea condensates. One or more modified melamine condensates and/or modified urea condensates may be used as the crosslinking agent.

Another crosslinking agent is a phenol compound having on the average at least two methylol or alkoxymethylol radicals in a molecule, examples of which include (2-hydroxy-5-methyl)-1,3-benzenedimethanol and 2,2',6,6'-tetramethoxymethylbisphenol A. One or more phenol compounds may be used as the crosslinking agent.

The foregoing amino condensates and phenol compounds may be used alone or in admixture as the crosslinking agent.

An appropriate amount of the crosslinking agent is 0.5 to 50 parts, and especially 1 to 30 parts by weight per 100 parts by weight of the epoxy-containing polymer, when determined from the standpoints of a proportion of epoxy radicals in the photo-curable resin composition and curability upon exposure.

The photoacid generator (C) is typically a compound which generates an acid upon exposure to light with a wavelength of 190 to 500 nm, the acid generated serving as a curing catalyst. Since the photo-curable resin composition of the invention is highly compatible with the photoacid generator, the photoacid generator may be selected from a wide variety of such compounds. Typical photoacid generators include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Exemplary onium salts are compounds of the following general formula (9).

(9)

Herein $R^{10}$ is a straight, branched or cyclic alkyl radical of 1 to 12 carbon atoms, an aryl radical of 6 to 12 carbon atoms, or an aralkyl radical of 7 to 12 carbon atoms, which may have a substituent; $M^+$ is iodonium or sulfonium; $K^-$ is a non-nucleophilic counter-ion; and h is 2 or 3.

Illustrative examples of alkyl radicals represented by $R^{10}$ include methyl, ethyl, propyl, butyl, cyclohexyl, 2-oxocyclohexyl, norbornyl, and adamantyl. Exemplary aryl radicals include phenyl; alkoxyphenyl radicals such as o-, m- or p-methoxyphenyl, ethoxyphenyl, m- or p-tert-butoxyphenyl; and alkylphenyl radicals such as 2-, 3- or 4-methylphenyl, ethylphenyl, 4-tert-butylphenyl, 4-butylphenyl, and dimethylphenyl. Exemplary aralkyl radicals include benzyl and phenethyl.

Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Exemplary diazomethane derivatives are compounds of the following general formula (10).

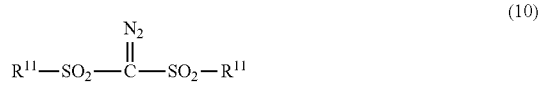

(10)

Herein $R^{11}$, which may be the same or different, is a straight, branched or cyclic alkyl or halogenated alkyl radical of 1 to 12 carbon atoms, aryl or halogenated aryl radical of 6 to 12 carbon atoms, or aralkyl radical of 7 to 12 carbon atoms.

Illustrative examples of alkyl radicals represented by $R^{11}$ include methyl, ethyl, propyl, butyl, amyl, cyclopentyl, cyclohexyl, norbornyl, and adamantyl. Exemplary halogenated alkyl radicals include trifluoromethyl, 1,1,1-trifluoroethyl, 1,1,1-trichloroethyl, and nonafluorobutyl. Exemplary aryl radicals include phenyl; alkoxyphenyl radicals such as o-, m- or p-methoxyphenyl, ethoxyphenyl, m- or p-tert-butoxyphenyl; and alkylphenyl radicals such as 2-, 3- or 4-methylphenyl, ethylphenyl, 4-tert-butylphenyl, 4-butylphenyl, and dimethylphenyl. Exemplary halogenated aryl radicals include fluorobenzene, chlorobenzene, and 1,2,3,4,5-pentafluorobenzene. Exemplary aralkyl radicals include benzyl and phenethyl.

Illustrative examples of the photoacid generator (C) include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, and diphenyl(4-thiophenoxyphenyl)sulfonium hexafluoroantimonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

oxime sulfonate derivatives such as α-(benzenesulfoniumoxyimino)-4-methylphenylacetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imido-yl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Also included are iminosulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2[(4-methylphenyl)sulfonyl]-1-[(4-methylthio)phenyl]-1-propane.

Among others, imido-yl sulfonates, imino sulfonates and oxime sulfonates are preferred.

The photoacid generators may be used alone or in admixture of two or more. The photoacid generator is preferably added in an amount of 0.05 to 20 parts by weight, and especially 0.2 to 5 parts by weight, per 100 parts by weight of the epoxy-containing polymer, when determined from the standpoints of the light absorption of the photoacid generator itself and photo-curability in thick film form.

The solvent used herein as component (D) may be any solvent in which the polymer (A), crosslinking agent (B), photoacid generator (C) and other components are soluble.

Illustrative, non-limiting, examples of the solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more thereof.

Of these solvents, preferred are ethyl lactate, cyclohexanone, cyclopentanone, propylene glycol monomethyl ether acetate, γ-butyrolactone, and mixtures thereof, in which the photoacid generator is most soluble.

An appropriate amount of the solvent (D) used is about 50 to 2,000 parts, and especially about 100 to 1,000 parts by weight per 100 parts by weight of all solids available from components (A) to (C), when determined from the standpoints of compatibility, viscosity, and ease of application of the photo-curable resin composition.

In the resist composition, a basic compound may be compounded as component (E). The basic compound used herein is preferably a compound capable of suppressing the rate of diffusion when the acid generated by the photoacid generator diffuses within the film. The inclusion of the basic compound holds down the rate of acid diffusion within the film, resulting in better resolution. In addition, it suppresses changes in sensitivity following exposure and reduces substrate and environment dependence, as well as improving the exposure latitude and the pattern profile.

The basic compound may be any well-known organic nitrogen-containing compounds. Examples of organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and compounds of the general formula (11).

$$N(Z)_n(Y)_{3-n} \quad (11)$$

In the formula, n is equal to 1, 2 or 3; side chain Y is independently hydrogen or a straight, branched or cyclic $C_1$-$C_{20}$ alkyl group which may contain an ether or hydroxyl group; and side chain Z is independently selected from groups of the following general formulas (12) to (14), and two or three Z's may bond together to form a ring.

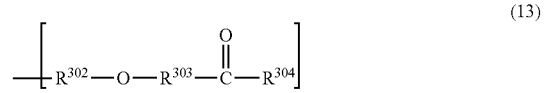

In the formulas, $R^{300}$, $R^{302}$ and $R^{305}$ are independently straight or branched $C_1$-$C_4$ alkylene groups; $R^{301}$ and $R^{304}$ are independently hydrogen, or straight, branched or cyclic $C_1$-$C_{20}$ alkyl groups, which may contain at least one hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group, which may contain at least one hydroxyl, ether, ester group or lactone ring.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Illustrative examples of the compounds of formula (11) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compounds may be used alone or in admixture of two or more. The basic compound is preferably formulated in an amount of 0 to 3 parts, and more preferably 0.01 to 1 part by weight per 100 parts by weight of the epoxy-containing polymer, when determined from the standpoint of sensitivity.

In addition to the aforementioned components, the photo-curable resin composition of the invention may include optional components. Suitable additives include a surfactant which is commonly used for improving the coating characteristics, and a light absorber which is commonly used for improving light absorption efficiency of photoacid generators or the like.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad FC-4430 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from DIC Corp., and X-70-093 from Shin-Etsu Chemical Co., Ltd. Preferred surfactants include Fluorad FC-4430 from Sumitomo 3M Ltd. and X-70-093 from Shin-Etsu Chemical Co., Ltd.

Exemplary light absorbers include diaryl sulfoxides, diaryl sulfones, 9,10-dimethylanthracene and 9-fluorenone.

The photo-curable resin composition of the invention is prepared in a conventional way. For example, it can be prepared by agitating and mixing the aforementioned components and optional additives in the solvent and passing the mixture through a filter to remove solids, if necessary.

The photo-curable resin composition thus prepared is useful as protective films for semiconductor devices, protective films on interconnections, cover-lay films, and solder resists. It can also be employed as an isolation film for TSVs or a photoresist material for microfabrication.

When a pattern is formed using the photo-curable resin composition, the patterning process involves the steps of (i) applying the photo-curable resin composition onto a substrate by a coating or suitable technique, to form a coating, (ii) exposing the coating to radiation having a wavelength of 190 to 500 nm through a photomask, and optionally heating the coating (known as post-exposure baking, PEB), and (iii) developing the exposed coating with a developer. After the coating is provided with a pattern through these steps, the step (iv) of heating the patterned coating is performed for post-curing purpose, eventually yielding the desired protective film.

More particularly, the photo-curable resin composition is first applied onto a substrate. The substrates used herein include silicon wafers, TSV silicon wafers, and plastic or ceramic circuit substrates. The application may employ well-known techniques complying with lithography. For example, the composition is applied by dipping, spin coating and roll coating. The coverage may be determined as appropriate for a particular purpose although a coating thickness of 0.1 to 100 μm is often preferred. A coating thickness of 1 to 100 μm, and specifically 3 to 50 μm is more preferred. In an alternative procedure, the composition may be previously formed into a film, which is attached to a substrate.

In order that effective photo-curing reaction take place, the solvent may be previously evaporated off by preheating or prebaking, if necessary. The prebaking is, for example, at 40 to 140° C. for 1 minute to 1 hour.

Then the coating is exposed to radiation having a wavelength of 190 to 500 nm through a photomask for effecting photo-curing reaction. The photomask used herein may be a member in which a desired pattern has been cut out. The photomask is preferably made of a material capable of shielding the radiation having a wavelength of 190 to 500 nm, for example, chromium although the photomask material is not limited thereto. Examples of the radiation having a wavelength of 190 to 500 nm include radiation of various wavelengths generated by radiation-emitting units, for example, UV radiation (e.g., g-line and i-line) and deep UV radiation (248 nm, 198 nm). A wavelength range from 248 to 436 nm is preferred. An appropriate exposure dose is 10 to 3,000 mJ/cm$^2$, but not limited thereto. At the end of exposure, the exposed area is crosslinked to form an insolubilized pattern which is insoluble in a certain solvent.

If desired for increasing the development sensitivity, the exposed coating may be heat treated. Such post-exposure baking (PEB) is effected, for example, at 40 to 140° C. for 0.5 to 10 minutes.

Following the exposure or exposure and PEB, the coating is developed with a developer. The developer is preferably any of customarily used solvents, for example, alcohols such as isopropyl alcohol (IPA), ketones such as cyclohexanone, and glycols such as propylene glycol monomethyl ether. The solvent which may be used as the solvent for the composition can be used at the development stage. Development is effected in a conventional manner, for example, by dipping the patterned coating in the developer. The development is followed by washing, rinsing and drying if necessary. There is obtained a composition coating having the desired pattern.

Although the pattern forming process has been described, it is sometimes unnecessary to form a pattern. When it is simply desired to form a uniform film, for example, the same process as above may be followed except that the photomask is not used.

If desired, the patterned coating may be post-cured by heating in an oven or hot plate at 100 to 250° C., preferably 150 to 220° C., and more preferably 170 to 190° C. Post-curing at a temperature of 100 to 250° C. is effective for increasing the crosslinking density of the coating and removing the residual volatile matter. Then a coating having augmented adhesion to substrates, heat resistance, high strength and good electrical properties can be formed. The post-curing time may range from 10 minutes to 10 hours.

Since the cured coating obtained from the photo-curable resin composition in the above-described way has improved substrate adhesion, heat resistance, electrical properties, mechanical properties, and chemical resistance in solder flux fluids, it can be advantageously used as a protective film on electric and electronic components and semiconductor devices. Semiconductor devices covered with the protective films remain reliable. In a thermal cycling test of the protective films, no cracks form.

EXAMPLE

Examples of the invention are given below by way of illustration and not by way of limitation. All parts are by weight. Mw stands for weight average molecular weight. The compounds M-1 through M-7 used in Synthesis Examples have the chemical structural formulae shown below.

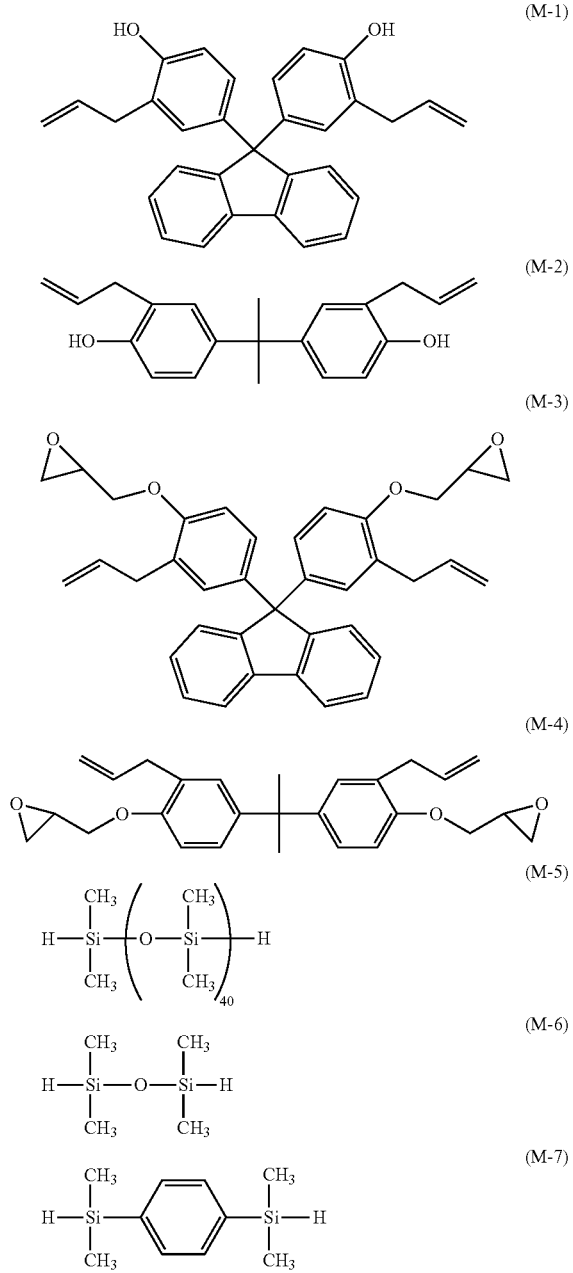

Synthesis Example 1

A 5-L flask equipped with a stirrer, thermometer, nitrogen purging line and reflux condenser was charged with 396.9 g of compound M-1 and 45.0 g of compound M-4 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 78° C. After the dropwise addition, the reaction solution was ripened for 3 hours at 90° C. The reaction solution was cooled down to room temperature, combined with 1,700 g of methyl isobutyl ketone (MIBK), and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 950 g of cyclopentanone was added to the polymer solution. This yielded a polymer solution (A-1) mainly in cyclopentanone having a solid concentration of 60 wt %. The polymer in the solution was measured for molecular weight by GPC versus polystyrene standards, finding a Mw of 62,000. The polymer corresponded to formula (1) wherein a=0.594, b=0.351, c=0.061, d=0.039, and (c+d)/(a+b+c+d)=0.10.

Synthesis Example 2

A 5-L flask equipped with a stirrer, thermometer, nitrogen purging line and reflux condenser was charged with 352.8 g of compound M-1 and 90.0 g of compound M-4 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 79° C. After the dropwise addition, the reaction solution was ripened for 3 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 980 g of cyclopentanone was added to the polymer solution. This yielded a polymer solution (A-2) mainly in cyclopentanone having a solid concentration of 60 wt %. The polymer in the solution was measured for molecular weight by GPC versus polystyrene standards, finding a Mw of 64,000. The polymer corresponded to formula (1) wherein a=0.480, b=0.320, c=0.120, d=0.080, and (c+d)/(a+b+c+d)=0.20.

Synthesis Example 3

A 5-L flask equipped with a stirrer, thermometer, nitrogen purging line and reflux condenser was charged with 308.7 g of compound M-1 and 135.0 g of compound M-4 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 80° C. After the dropwise addition, the reaction solution was ripened for 3 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 900 g of cyclopentanone was added to the polymer solution. This yielded a polymer solution (A-3) mainly in cyclopentanone having a solid concentration of 60 wt %. The polymer in the solution was measured for molecular weight by GPC versus polystyrene standards, finding a Mw of 68,000. The polymer corresponded to formula (1) wherein a=0.420, b=0.280, c=0.180, d=0.120, and (c+d)/(a+b+c+d)=0.30.

Synthesis Example 4

A 5-L flask equipped with a stirrer, thermometer, nitrogen purging line and reflux condenser was charged with 220.5 g of compound M-1 and 225.0 g of compound M-4 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 80° C. After the dropwise addition, the reaction solution was ripened for 3 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 950 g of cyclopentanone was added to the polymer solution. This yielded a polymer solution (A-4) mainly in cyclopentanone having a solid concentration of 60 wt %. The polymer in the solution was measured for molecular weight by GPC versus polystyrene standards, finding a Mw of 75,000. The polymer corresponded to formula (1) wherein a=0.294, b=0.206, c=0.306, d=0.194, and (c+d)/(a+b+c+d)=0.50.

Synthesis Example 5

A 5-L flask equipped with a stirrer, thermometer, nitrogen purging line and reflux condenser was charged with 352.8 g of compound M-1 and 116.1 g of compound M-3 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 73° C. After the dropwise addition, the reaction solution was ripened for 3 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 940 g of cyclopentanone was added to the polymer solution. This yielded a polymer solution (A-5) mainly in cyclopentanone having a solid concentration of 60 wt %. The polymer in the solution was measured for molecular weight by GPC versus polystyrene standards, finding a Mw of 55,000. The polymer corresponded to formula (1) wherein a=0.486, b=0.314, c=0.114, d=0.086, and (c+d)/(a+b+c+d)=0.20.

Synthesis Example 6

A 5-L flask equipped with a stirrer, thermometer, nitrogen purging line and reflux condenser was charged with 441.0 g of compound M-1 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 78° C. After the dropwise addition, the reaction solution was ripened for 5 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 950 g of cyclopentanone was added to the polymer solution. This yielded a polymer solution (B-1) mainly in cyclopentanone having a solid concentration of 60 wt %. The polymer in the solution was measured for molecular weight by GPC versus polystyrene standards, finding a Mw of 51,000. The polymer corresponded to formula (1) wherein a=0.590, b=0.410, c=0, d=0, and (c+d)/(a+b+c+d)=0.

Synthesis Example 7

A 5-L flask equipped with a stirrer, thermometer, nitrogen purging line and reflux condenser was charged with 225.0 g of compound M-1 and 161.2 g of compound M-2 in 1,875 g of toluene and further with 949.6 g of compound M-5 and 6.1 g of compound M-6. After the flask was heated at 60° C., 2.2 g of a platinum-on-carbon catalyst (5 wt %) was added. It was observed that the interior reaction temperature rose to 65-67° C., after which the reaction solution was further heated at 90° C. for 3 hours. The reaction solution was again cooled to 60° C., 2.2 g of a platinum-on-carbon catalyst (5 wt %) was added, and 107.3 g of compound M-7 was added dropwise over one hour. This time the flask interior temperature rose to 75° C. After the dropwise addition, the reaction solution was ripened for 5 hours at 90° C. The reaction solution was cooled down to room temperature, combined with 1,700 g of MIBK, and filtered through a filter under pressure to remove the platinum catalyst. To the polymer solution was added 760 g of deionized water. The combined solution was agitated and allowed to stand for separation, after which the lower or aqueous layer was removed. This water washing/separating operation was repeated 6 times until the minute acid fraction was removed from the polymer solution. The solvent was distilled off in vacuum and instead, 900 g of cyclopentanone was added to the polymer solution. This yielded a polymer solution (B-2) mainly in cyclopentanone having a solid concentration of 60 wt %. The polymer in the solution was measured for molecular weight by GPC versus polystyrene standards, finding a Mw of 53,000. The polymer corresponded to formula (1) wherein a=0.600, b=0.400, c=0, d=0, and (c+d)/(a+b+c+d)=0.

Examples 1 to 8 and Comparative Examples 1 to 4

Photo-curable resin compositions of Examples 1 to 8 and Comparative Examples 1 to 4 were prepared by combining the polymer solutions synthesized in Synthesis Examples 1 to 7, with a crosslinker, a photoacid generator, a basic compound, a solvent and additives according to the recipe shown in Table 1, agitating and mixing them for dissolution, and precision filtering through a Teflon® filter with a pore size of 0.2 µm.

Thereafter, using a spin coater, each of the compositions was coated onto an untreated 6-inch silicon wafer to a thickness as shown in Table 1. The coated silicon substrate was prebaked on a hot plate at 130° C. for 2 minutes for removing the solvent. Through a quartz mask having a pattern of equispaced lines having a width varying from 1 µm to 50 µm, the coating was exposed to radiation with wavelength 405 nm in an exposure dose as shown in Table 1. The exposure tool used was a mask aligner by SUSS MicroTec AG. The exposure was followed by PEB on a hot plate at 130° C. for 3 minutes and cooling. Thereafter, the coated substrate was developed by spraying 2-propanol for 5 minutes. The width of lines which could be resolved is reported in Table 1 together with the thickness of the coating as developed.

Separately, the photo-curable resin compositions of Examples 1 to 8 and Comparative Examples 1 to 4 were evaluated for several properties.

Stripper Resistance

A cured resin composition was examined for resistance to a stripper, specifically N-methyl-2-pyrrolidone (NMP) commonly used in the fabrication of semiconductor devices. For each composition, a pattern of 15 mm×15 mm was formed on a wafer by the same procedure as used in the crack resistance test to be described later. The coated wafer was immersed in NMP at room temperature for 1 hour. The resin film was examined for thickness change and outer appearance, from which stripper resistance was rated.

Electrical Properties (Dielectric Breakdown Strength)

The photo-curable resin composition was evaluated for dielectric breakdown strength by diluting it with cyclohexanone to a polymer solid concentration of 10 wt %. The diluted solution was spin coated on a 6-inch silicon wafer and pre-baked for solvent removal. The coated substrate was exposed to radiation over its entire surface without using a quartz mask. This was followed by PEB and spray development for 2 minutes with 2-propanol. The coating left after these steps was further heated in an oven at 180° C. for 2 hours, yielding a cured film of 0.8 µm thick. The cured film was measured for dielectric breakdown strength by a CV-IV measuring system SSM600 by Solid State Measurements, Inc.

Adhesion

The photo-curable resin composition was evaluated for adhesion to substrates. The resin composition was spin coated onto a silicon wafer (substrate) and pre-baked for solvent removal. The coated substrate was exposed to radiation through a quartz mask. This was followed by PEB and development with 2-propanol. The coating left after these steps as spots having a diameter of 300 µm and a height of 25 µm was further heated in an oven at 180° C. for 2 hours, yielding a post-patterning cured film. The post-patterning cured film was tested for initial adhesion by using a bond tester Dage series 4000-PXY by Dage Precision Industries and measuring a resistance force in peeling the film from the substrate. The test conditions included a pulling speed of 50.0 µm/sec and a test height of 3.0 µm. FIG. 1 illustrates an adhesion measuring method. Relative to a post-patterning cured film 2 on a silicon substrate 1, a measuring jig 3 of the bond tester is moved in the direction of arrow 4. An average of 15 measurement points is reported, with a larger value indicating greater adhesion of the post-patterning cured film to the substrate.

The film was also examined for resistance to a chemical, specifically solder flux fluid. Specifically, the test involved the steps of applying a solder flux fluid onto the post-patterning cured film on the substrate, heating at 220° C. for 30 seconds, cooling, washing with deionized water, and drying at room temperature for 2 hours. The post-patterning cured film was tested for adhesion after degradation by using the bond tester and measuring a resistance force in peeling the film from the substrate.

Reliability

The cured resin composition was examined for crack resistance after thermal cycling. The resin composition was spin coated onto a silicon wafer having 200 holes having a diameter of 50 µm and a depth of 200 µm so that the holes were also filled with the composition, and pre-baked for solvent removal. The coated substrate was exposed over its entire surface to radiation. This was followed by PEB, development with 2-propanol, and post-curing at 180° C. for 2 hours. There was obtained a cured film which was buried in the holes as well. The substrate bearing the cured film was placed in a thermal cycling tester where thermal cycling between −55° C. and 150° C. was repeated until 1,000 cycles. During the test, the cured film buried in the holes was observed for the occurrence of cracks.

The results are shown in Table 2.

TABLE 1

| | | Composition component (pbw) | | | | | Thickness after development (µm) | Maximum resolution (µm) |
| --- | --- | --- | --- | --- | --- | --- | --- | --- |
| | | Polymer | PAG | Crosslinker | Basic compound | Organic solvent | | Exposure dose (mJ/cm$^2$) |
| Example | 1 | A-1 100 pbw | PAG-1 2 pbw | CL-1 10 pbw | AM-1 0.1 pbw | Cyclopentanone 95 pbw | 24.5 | 15 850 |
| | 2 | A-2 100 pbw | PAG-1 2 pbw | CL-1 10 pbw | AM-1 0.1 pbw | Cyclopentanone 95 pbw | 25.0 | 10 670 |

TABLE 1-continued

|  |  | Composition component (pbw) | | | | Thickness after development (μm) | Maximum resolution (μm) Exposure dose (mJ/cm²) |
| --- | --- | --- | --- | --- | --- | --- | --- |
|  |  | Polymer | PAG | Crosslinker | Basic compound | Organic solvent |  |  |
|  | 3 | A-3 100 pbw | PAG-1 2 pbw | CL-1 10 pbw | AM-1 0.1 pbw | Cyclopentanone 95 pbw | 24.3 | 10 580 |
|  | 4 | A-4 100 pbw | PAG-1 2 pbw | CL-1 10 pbw | AM-1 0.1 pbw | Cyclopentanone 95 pbw | 24.9 | 15 440 |
|  | 5 | A-5 100 pbw | PAG-1 2 pbw | CL-1 10 pbw | AM-1 0.1 pbw | Cyclopentanone 95 pbw | 25.0 | 10 700 |
|  | 6 | A-2 100 pbw | PAG-2 2 pbw | CL-1 10 pbw | AM-1 0.1 pbw | Cyclopentanone 95 pbw | 24.6 | 20 270 |
|  | 7 | A-2 100 pbw | PAG-1 2 pbw | CL-2 10 pbw | AM-1 0.1 pbw | Cyclopentanone 95 pbw | 24.3 | 30 810 |
|  | 8 | A-3 100 pbw | PAG-1 2 pbw | CL-2 10 pbw | AM-1 0.1 pbw | Cyclopentanone 95 pbw | 24.9 | 20 840 |
| Comparative Example | 1 | B-1 100 pbw | PAG-1 2 pbw | CL-1 10 pbw | AM-1 0.1 pbw | Cyclopentanone 95 pbw | 25.2 | 40 870 |
|  | 2 | B-2 100 pbw | PAG-1 2 pbw | CL-1 10 pbw | AM-1 0.1 pbw | Cyclopentanone 95 pbw | 25.1 | 30 760 |
|  | 3 | B-1 100 pbw | PAG-2 2 pbw | CL-1 10 pbw | AM-1 0.1 pbw | Cyclopentanone 95 pbw | 24.8 | 50 350 |
|  | 4 | B-1 100 pbw | PAG-1 2 pbw | CL-2 10 pbw | AM-1 0.1 pbw | Cyclopentanone 95 pbw | 24.7 | 40 900 |

The photoacid generators (PAG) used are as follows.

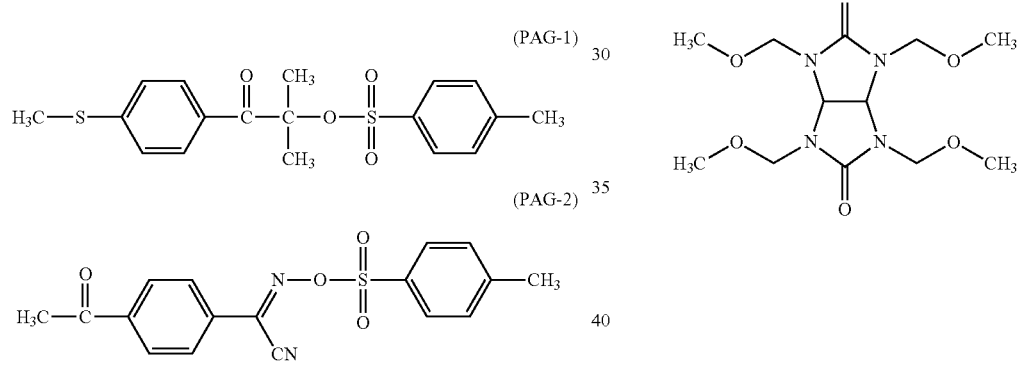

The crosslinkers used are as follows.

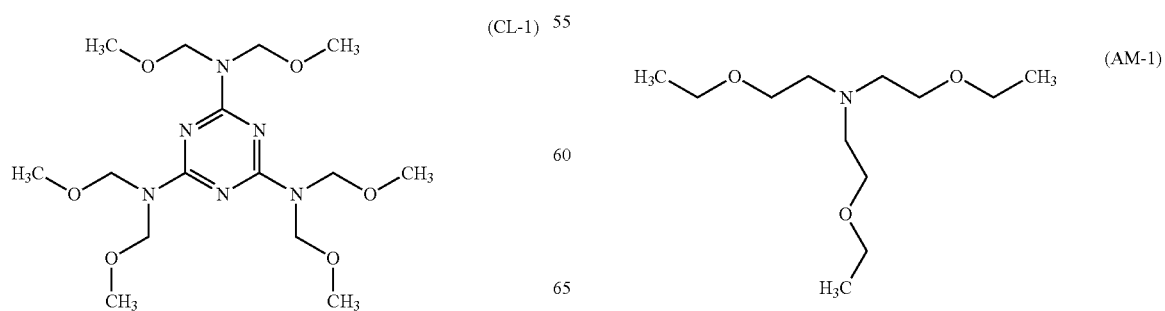

The basic compound used is as follows.

TABLE 2

|  |  | Stripper resistance after NMP immersion | Electrical property Dielectric breakdown strength (V/μm) | Adhesion (mN) | | Reliability after thermal cycling |
|---|---|---|---|---|---|---|
|  |  |  |  | Initial | After degradation |  |
| Example | 1 | Appearance and thickness unchanged | 400 | 350 | 290 | cracked at 750 cycles |
|  | 2 | Appearance and thickness unchanged | 450 | 475 | 450 | no cracks |
|  | 3 | Appearance and thickness unchanged | 450 | 390 | 355 | no cracks |
|  | 4 | Appearance and thickness unchanged | 400 | 335 | 300 | no cracks |
|  | 5 | Appearance and thickness unchanged | 400 | 440 | 410 | no cracks |
|  | 6 | Appearance and thickness unchanged | 400 | 325 | 120 | no cracks |
|  | 7 | Appearance and thickness unchanged | 400 | 460 | 425 | no cracks |
|  | 8 | Appearance and thickness unchanged | 400 | 400 | 375 | no cracks |
| Comparative Example | 1 | Appearance and thickness unchanged | 350 | 270 | 45 | cracked at 250 cycles |
|  | 2 | Thickness increase by swelling | 300 | 265 | 40 | cracked at 250 cycles |
|  | 3 | Appearance and thickness unchanged | 320 | 220 | 25 | cracked at 250 cycles |
|  | 4 | Thickness increase by swelling | 300 | 240 | 50 | cracked at 250 cycles |

Japanese Patent Application No. 2009-226214 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An epoxy-containing polymer comprising recurring units of the following general formula (1) and having a weight average molecular weight of 3,000 to 500,000,

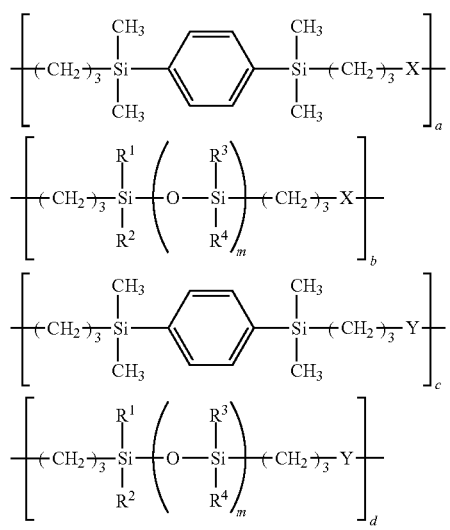

wherein $R^1$ to $R^4$ are each independently a monovalent hydrocarbon radical of 1 to 8 carbon atoms, m is an integer of 1 to 100, a, b and d are each 0 or a positive number, satisfying $0.05 \leq c/(a+b+c+d) \leq 0.5$ and $0.05 \leq (c+d)/(a+b+c+d) \leq 1.0$, X and Y are each independently a divalent organic radical of the general formula (2) or (3) with proviso that at least one divalent organic radical of formula (3) is present:

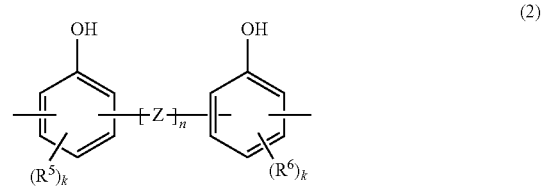

wherein Z is a divalent organic radical selected from the group consisting of

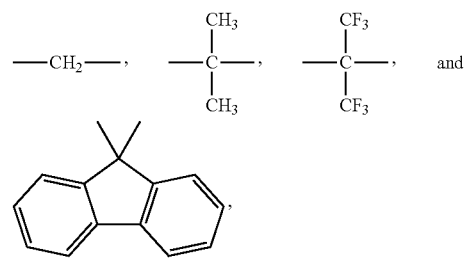

n is 0 or 1, $R^5$ and $R^6$ are each independently an alkyl or alkoxy radical of 1 to 4 carbon atoms, and k is 0, 1 or 2,

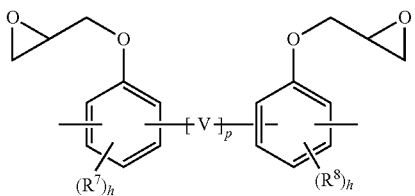

(3)

wherein V is a divalent organic radical selected from the group consisting of

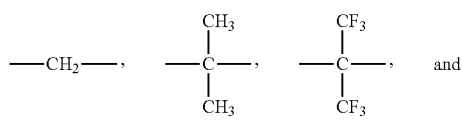

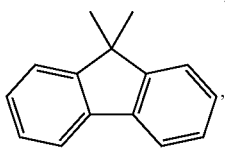

p is 0 or 1, R⁷ and R⁸ are each independently an alkyl or alkoxy radical of 1 to 4 carbon atoms, and h is 0, 1 or 2.

2. The polymer of claim 1 wherein in formula (1), a, b, c and d satisfy $0.05 \leq d/(a+b+c+d) \leq 0.5$.

3. A photo-curable resin composition comprising (A) an epoxy-containing polymer, (B) at least one crosslinking agent selected from the group consisting of an amino condensate modified with formalin or formalin-alcohol and a phenol compound having on the average at least two methylol or alkoxymethylol radicals in the molecule, (C) a photoacid generator which is decomposed to generate an acid upon exposure to radiation having a wavelength of 190 to 500 nm, and (D) a solvent, wherein said epoxy-containing polymer of component (A) comprising recurring units of the following general formula (1) and having a weight average molecular weight of 3,000 to 500,000, (1)

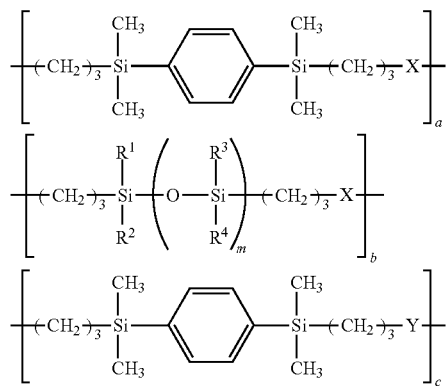

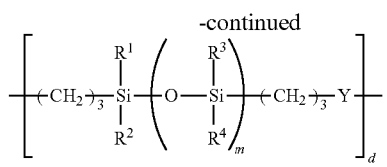

wherein $R^1$ to $R^4$ are each independently a monovalent hydrocarbon radical of 1 to 8 carbon atoms, m is an integer of 1 to 100, a, b, c and d each are 0 or a positive number, with the proviso that c and d are not equal to 0 at the same time, satisfying $0 \leq (c+d)/(a+b+c+d) \leq 1.0$, X and Y are each independently a divalent organic radical of the general formula (2) or (3) with the proviso that at least one divalent organic radical or formula (3) is present:

(2)

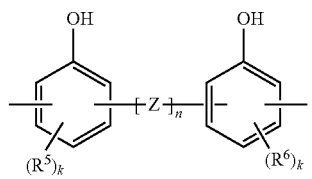

wherein Z is a divalent organic radical selected from the group consisting of

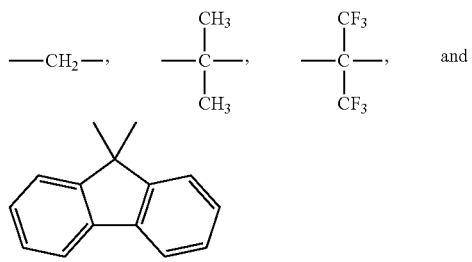

n is 0 or 1, $R^5$ and $R^6$ are each independently an alkyl and alkoxy radical of 1 to 4 carbon atoms, and k is 0, 1 or 2, (3)

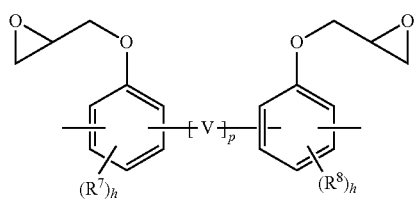

wherein V is a divalent organic radical selected from the group consisting of

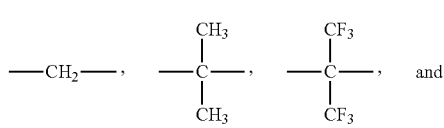

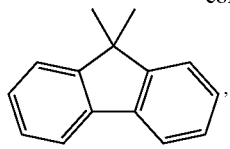

p is 0 or 1, $R^7$ and $R^8$ are each independently an alkyl or alkoxy radical of 1 to 4 carbon atoms, and h is 0, 1 or 2.

4. The photo-curable resin composition of claim 3, further comprising (E) a basic compound.

5. A process for forming a pattern, comprising the steps of:
 (i) applying the photo-curable resin composition of claim 3 onto a substrate to form a coating thereon,
 (ii) exposing the coating to radiation having a wavelength of 190 to 500 nm through a photomask,
 (iii) heat treating the exposed coating and developing it with a developer.

6. The process of claim 5, further comprising the step (iv) of post-curing the patterned coating resulting from the developing step at a temperature in the range of 100 to 250° C.

7. An electric/electronic part protective film comprising the coating obtained after the developing step of claim 5.

8. The photo-curable resin composition of claim 3, wherein in formula (1), a, b, c and d satisfy $0.05 \leq c/(a+b+c+d) \leq 0.5$.

9. The photo-curable resin composition of claim 3, wherein in formula (1), a, b, c and d satisfy $0.05 \leq d/(a+b+c+d) \leq 0.5$.

\* \* \* \* \*